United States Patent [19]
Smithers

[11] Patent Number: 5,466,970
[45] Date of Patent: Nov. 14, 1995

[54] HOOKED SPRING CLIP

[75] Inventor: Matthew C. Smithers, Lewisville, Tex.

[73] Assignee: Thermalloy, Inc., Dallas, Tex.

[21] Appl. No.: 933,781

[22] Filed: Aug. 24, 1992

[51] Int. Cl.[6] .............................. H01L 23/34; H01L 23/06
[52] U.S. Cl. ........................ 257/712; 257/718; 257/719
[58] Field of Search ................................ 357/81; 361/380, 361/388

[56] References Cited

U.S. PATENT DOCUMENTS 5,068,764  11/1991  Bland et al. .............................. 357/81

Primary Examiner—Sara W. Crane
Assistant Examiner—Carl Whitehead, Jr.
Attorney, Agent, or Firm—Jack A. Kanz

[57] ABSTRACT

A spring clip having a flat base and a spring portion extending from the base portion intermediate its ends supporting a finger is used to hold an electronic device package in thermal contact with a heat sink by hooking one end of the base into a groove in the heat sink.

12 Claims, 3 Drawing Sheets

HOOKED SPRING CLIP

This invention relates to securing electronic device packages to heat sinks. More particularly, it relates to spring clips with end portions which removeably mate with grooves in heat sinks to secure the clip to the heat sink while the clip holds a device package adjacent the heat sink.

Many electronic device packages are designed to conduct heat from the circuit device chip contained therein to a surface of the package. Typically, one face of the package is formed by a ceramic or metal body which acts as a heat transfer medium to conduct heat from the electronic device to an external surface of the package. External heat dissipating means such as a heat sink must be positioned in thermal communication with the heat transfer body to absorb the heat and/or dissipate it into the surrounding environment. The device package may be secured to the heat sink with adhesives and or mechanical means such as screws or the like. Spring clips are also used where ease of attachment and removal are a consideration. Most spring clips, however, are an integral part of the heat sink and/or require use of special tools to insert the device package without damaging the package. For ease and flexibility of use, it is desirable that spring clips permit the insertion of device packages without use of special tools and without applying excessive force on the package. It is also quite desirable that location of the clip on the heat sink be variable and that the clip can be readily removed or repositioned.

The present invention provides a clip arrangement which uniquely satisfies all the foregoing requirements yet is inexpensive and easy to manufacture. The clip of the invention comprises a unitary elongated body which defines a base portion, a spring portion and a finger portion. The base portion has a flat face with one end adapted to mate with a groove in the heat sink. The base portion supports the spring portion intermediate its ends. The finger portion is supported by the spring portion and adapted to urge the device package into contact with a surface on the heat sink. Because one end of the base is hooked into a groove in the heat sink, the clip remains free and easily removeable from the heat sink unless a device package is trapped between the finger and the heat sink. Thus the clip is readily removable. The clip and device package can be readily assembled on the heat sink manually by applying pressure to the base portion and/or spring portion. Thus the apparatus can be readily assembled without use of special tools and without fear of damaging the device package during assembly. Other features and advantages of the invention will become more readily understood from the following detailed description taken in connection with the appended claims and attached drawing in which:

Figure 1:
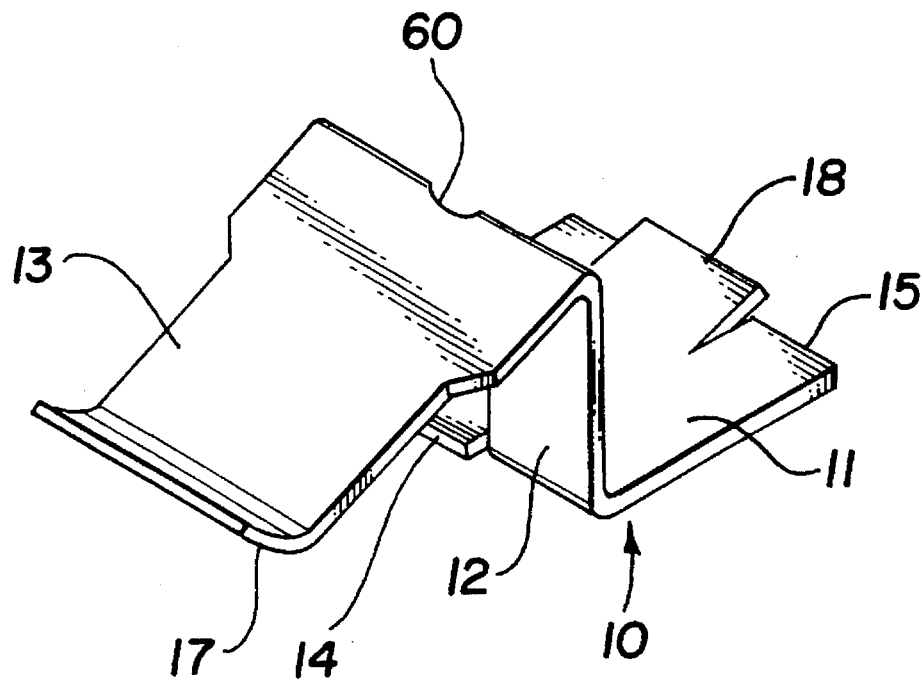
FIG. 1 is a perspective view of a preferred embodiment of the spring clip of the invention.
Figure 2:
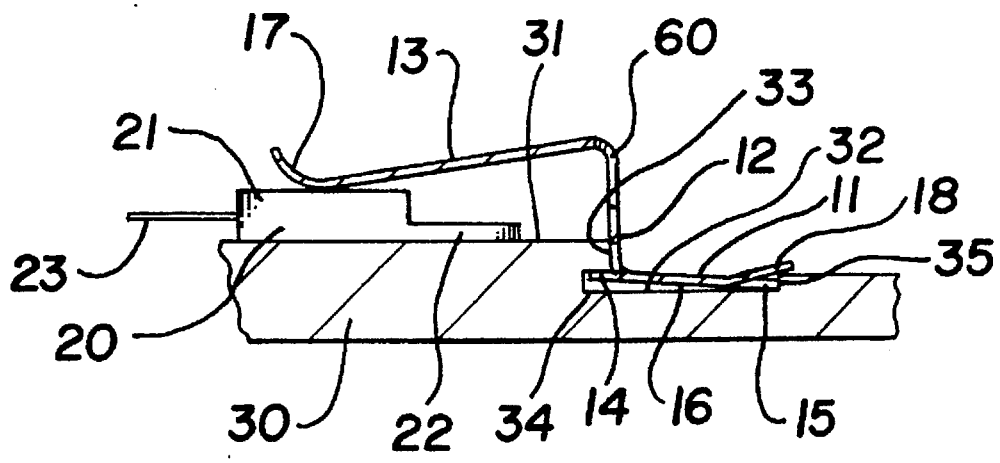
FIG. 2 is an elevational view partially in cross-section of the clip of FIG. 1 in combination with a device package and a heat sink.

As illustrated in FIGS. 1 and 2, the clip of the invention comprises a unitary elongated body 10 formed of suitable resilient material such as stainless steel or the like. The body 10 may, of course, be formed of other suitable materials such as plastic, aluminum alloys, etc., depending upon the particular application in which it is to be employed and other considerations such as cost, etc.

The body 10 is formed to define a base portion 11 and a finger portion 13 joined by a spring portion 12. It will be readily recognized that where the unitary body 10 is formed from a single elongated piece of metal or the like base portion 11, spring portion 12 and finger portion 13 will all have the same physical characteristics The terms "base portion" "spring portion" and "finger portion" are used herein to describe the function and relative position of each portion of the unitary body. Obviously, the spring portion 12 and the finger portion 13 are equally resilient and will bend as required to entrap an electronic device package as described hereinafter.

Base portion 11 defines a substantially flat face 16 with opposed ends 14 and 15. Spring portion 12 extends from the base portion 11 intermediate the ends thereof in a direction opposite the substantially flat face 16. Finger portion 13 extends from the spring portion 12 in a direction substantially parallel with flat face 16 but inclined with respect to the plane of the flat face 16 so that the finger portion 13 projects toward the plane of the flat face 16. Finger portion 13 may have a curved lip 17 at the end thereof to aid in insertion of an electronic device package as described hereinafter.

As illustrated in FIG. 2 unitary body 10 is adapted to secure an electronic device package 20 adjacent and in thermal communication with a heat sink 30 so that the heat sink 30 may dissipate thermal energy generated within the device package 20. In the embodiment illustrated device package 20 represents a standard TO-220 package having a plastic body 21 with a thermal transfer plate 22 forming one surface thereof. Terminal leads 23 project from one end of the package 20 for interconnection with an electrical circuit. The thermal transfer plate 22 is usually a metal plate in thermal communication with an electronic circuit chip encapsulated within body 21 and is adapted to be positioned adjacent a heat sink such as metal body 30.

Heat sink 30 comprises a metal body having a first surface 31 and a second surface 32 substantially parallel with and laterally displaced from first surface 31. In the embodiment illustrated a shoulder 33 joins first surface 31 and second surface 32 and a has a groove 34 therein which substantially forms an extension of second surface 32. In the preferred embodiment second surface 32 is the floor of a channel defined by shoulder 33 and a second shoulder 35 and the distance between shoulder 33 and second shoulder 35 is less than the length of base portion 11.

Referring now to FIG. 2, it will be observed that the device package 20 may be positioned on first surface 31 in the desired position and location and secured thereon by spring clip body 10. To secure the device package 20 in position, the curved lip 17 is positioned adjacent the device package 20 and the first end 14 of base portion 11 inserted into groove 34. In order to secure the package 20 in position, the spring portion 12 must be placed under tension. Accordingly, the length of finger portion 13 and the angle at which it projects toward the plane of base portion 11 will be determined by the thickness of electronic device package 20 and the height of shoulder 33. These variables, however, can be predetermined to provide spring clips of various designs which will be readily attached to heat sinks of accommodating designs. Since first end 14 is hooked within groove 34, the electronic device package 20 is entrapped and maintained in position until the clip body 10 is removed.

In order to provide further security, the second end 15 of base portion 11 may be forced into the channel and lodged adjacent second shoulder 35 to prevent movement of the clip 10 in the plane of base portion 11. In this position the clip body 10 is firmly secured to the heat sink 30 and urges the thermal transfer plate 22 of the electronic device package 20 into contact with the first surface 31 of the heat sink 30. If desired, a tab 18 may be formed to extend from the base portion 11 adjacent second end 15 to aid in raising the base portion 11 above the second shoulder 35 for removal of the clip body 10 from the heat sink 30.

Figure 4:
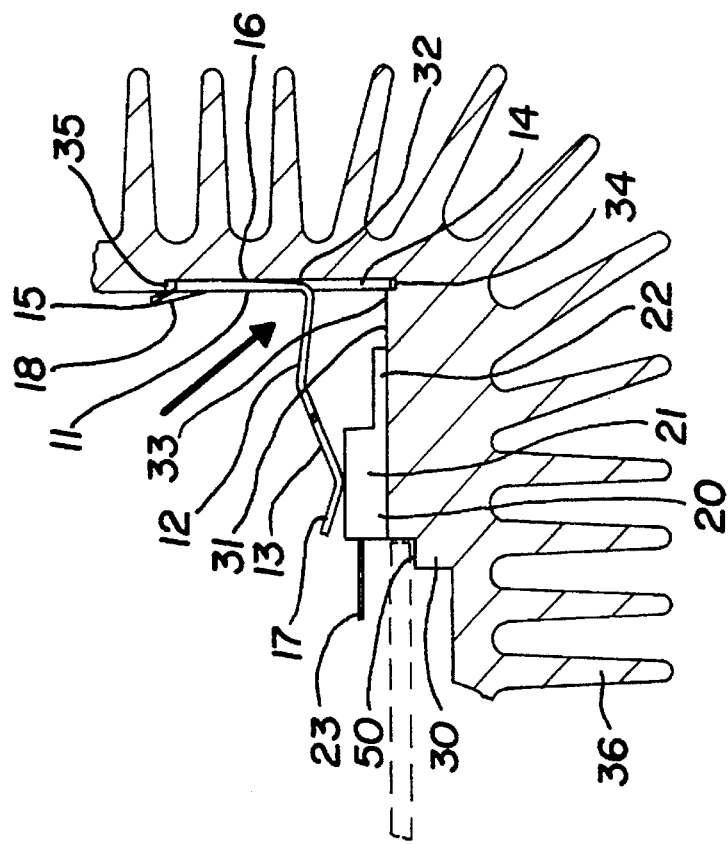
FIG. 4 is an elevational view of the clip of FIG. 3 in combination with a device package and an extruded frame heat sink illustrated in section.
Figure 3:
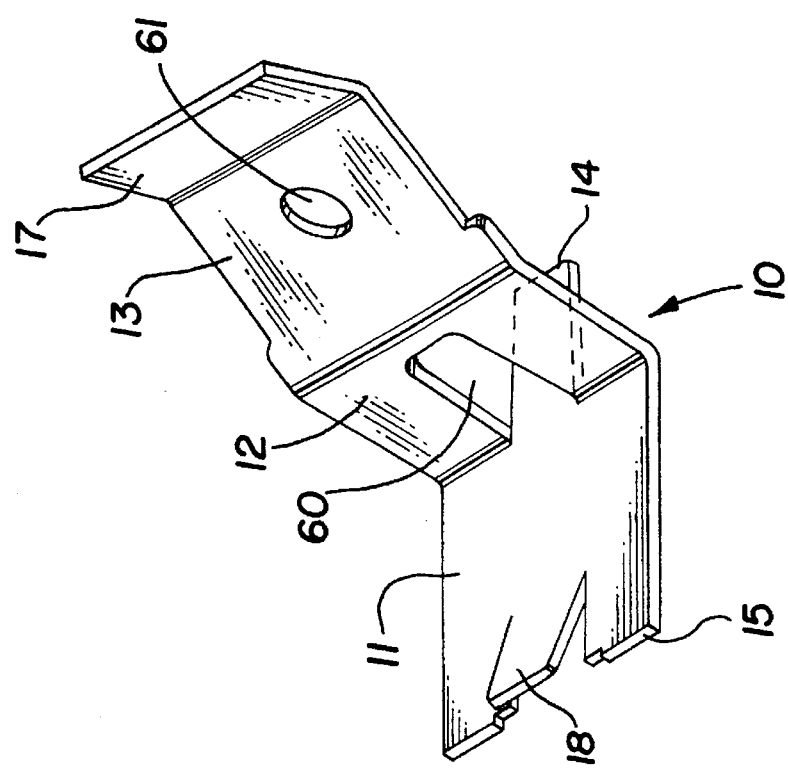
FIG. 3 is a perspective view of another preferred embodiment of the spring clip of the invention.

An alternative embodiment of the invention is illustrated in FIGS. 3 and 4. As illustrated in FIG. 4 the first surface 31 of heat sink 30 is not parallel with the second surface 32 but positioned in a plane substantially normal thereto. The heat sink 30 illustrated is an extruded open frame which has fins 36 or the like for dissipation of thermal energy. Since the first surface 31 lies in a plane substantially normal to second surface 32, elongated body 10 is configured so that the finger portion 13 projects substantially perpendicular to (instead of parallel with) base portion 11 but is inclined in the direction of first end 14. Accordingly, when an electronic device package 20 is properly positioned it can be retained in place by inserting first end 14 within groove 34 as described hereinabove. In the configuration of FIG. 4, the shoulder 33 may be formed by the first surface 31. While first surface 31 and second surface 32 are illustrated in parallel planes in FIG. 2 and in intersecting normal planes in FIG. 4, it will be appreciated that the invention is equally applicable to use in connection with surfaces 31 and 32 which lie in other intersecting planes by simply adjusting the angle at which the finger portion 13 depends from the spring portion 12 and/or by varying the configuration of the spring portion 12.

It will be observed that no special tools are required to attach the electronic device package to the heat sink using the spring clip of the invention. Instead, the electronic device package 20 and clip 10 are properly positioned on the heat sink 30 and the first end 14 of base portion 11 forced into position by applying pressure at the junction of base portion 11 and spring portion 12 as illustrated by the arrow in FIG. 4. When pressure is applied as illustrated, finger portion 13 is forced into contact with the plastic body 21 and urges thermal transfer plate 22 into thermal contact with first surface 31 of the heat sink 30. As additional pressure is applied, spring 12 is placed under tension, first end 14 slides into groove 34 and second end 15 passes over the edge of second shoulder 35 to maintain the assembly securely affixed. The assembly can be easily and readily disassembled by urging tab 18 upwardly to free second end 15 from second shoulder 35 and releasing the tension on spring 12.

The clips of the invention find particular utility in apparatus such as open frame extruded power supplies and the like wherein the frame of the apparatus is an extruded part to which a plurality of device packages are secured. For example, in the configuration illustrated in FIG. 4, the heat sink 30 is an extruded frame which defines a channel which having a lip 50 extending the axial length thereof. The apparatus to be constructed, such as a power supply or the like, is formed by attaching electronic components to a circuit board (illustrated in phantom in FIG. 4) and securing the circuit board to the lip 50 on heat sink frame 30. Components such as device package 20 are secured to the circuit board and aligned to extend past the edge of the board as shown in FIG. 4. The packages 20 must then be secured to the heat sink 30. In prior art assemblies, the thermal transfer pad 22 was secured to the frame by drilling a hole in the frame corresponding to a hole in the pad 22 so that the pad 22 could be secured to the frame 30 with a screw or the like. It will be readily recognized that the expensive and time-consuming operations required to drill and tap the heat sink and thereafter secure the pad 22 to the heat sink with screws are all eliminated by use of the clips of the invention. Instead, grooves 34 and shoulders 33 and 35 can be formed in the extruded frame part during manufacture. The clips 10 can then be manually inserted during final assembly, eliminating all the drill and tap operations and use of special tools and loose parts such as screws and the like.

In the embodiment of FIG. 4, surfaces 31 and 32 are at right angles because the pad 22 of the device package is arranged parallel with the surface of the circuit board. However, where the pad 22 is arranged normal to the surface of the circuit board, clips 10 such as illustrated in FIGS. 1 and 2 can be used.

It is important to note that where the device packages 20 are secured to a heat sink such as in an extruded open frame apparatus, attachment of the clip 10 to the heat sink frame 30 occurs as a final assembly operation. Thus great care must be taken to assure that the clips 10 have been properly secured without damaging the package 20, the circuit board or other components thereon. It is, of course, somewhat difficult to visually inspect the final assembly because the spring portion 12 and finger portion 13 obscure the device package 20. To alleviate this problem, a window 60 is formed in the spring portion 12 of clip 20 so that the device package 20 will be visible through the window 60 when viewed along a sight line substantially parallel with the base 11. Thus, when the clip 10 and device package 20 are installed on the heat sink 30, the assembly can be visually inspected and package 20 can be viewed through window 60 to confirm that the components are properly assembled. If desired, a window 61 may be formed in the finger portion 13 for the same purpose. Where the clip body 10 is formed by stamping and the like, windows 60 and 61 can conveniently be formed by punching the window from the metal strip or may be formed by a lance-out as shown in FIG. 3.

Figure 5:
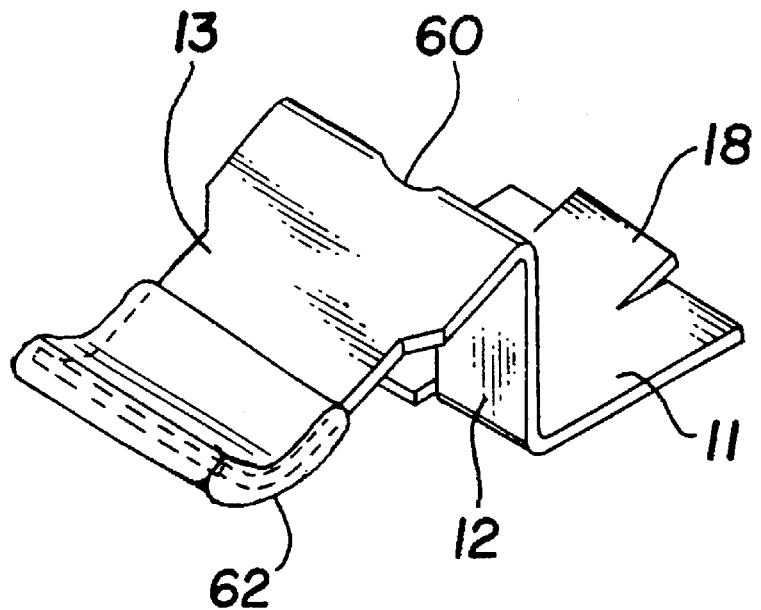
FIG. 5 is a perspective view of a spring clip of the invention employing an insulating cover.
Figure 6:
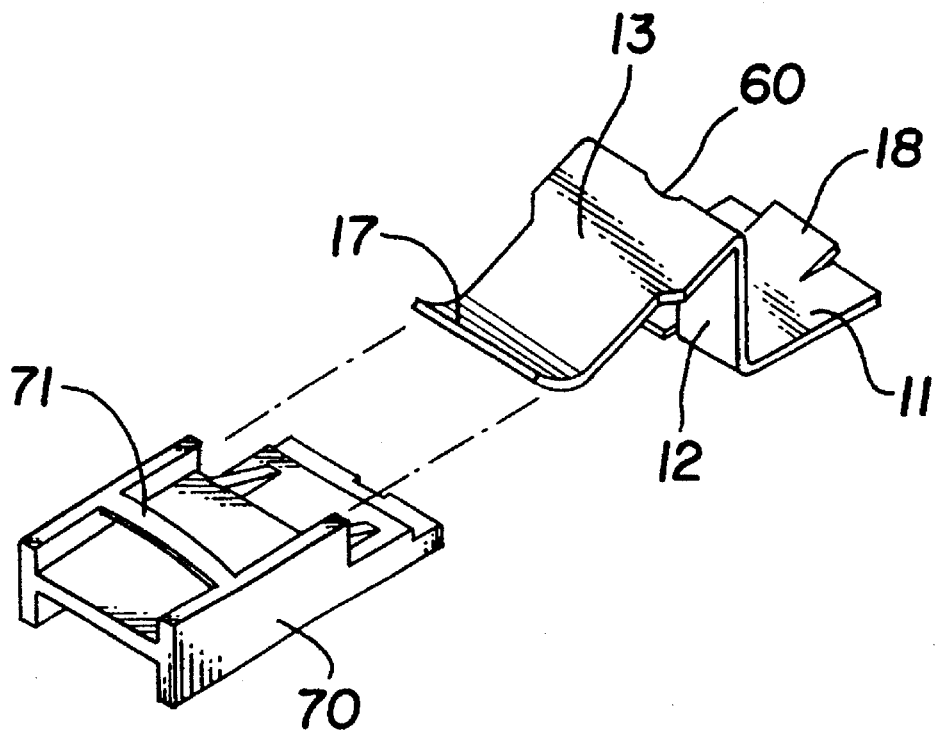
FIG. 6 is an exploded view of a subassembly of an insulating cover and spring clip in accordance with the principles of the invention.

In installations where electrical insulation between the clip 10 and the device package 20 is required, an insulating cover such as that disclosed in U.S. Pat. No. 5,019,942 may be used. Alternatively, the end of finger portion 13 may be covered with a suitable insulating material 62 as shown in FIG. 5. The insulating material 62 may be a rubber or plastic cap which fits over the end of finger portion 13 or may be formed by molding or dipping the end of the finger portion 13 in a suitable insulating material 62.

Where a specific creep distance is required, insulating covers as disclosed in U.S. Pat. No. 5,019,942 are particularly useful. Unfortunately, hand assembly of the device package 20, clip 10 and the cover can be difficult in confined spaces. As illustrated in FIG. 6, the insulating cover 70 is formed with a strap 71 or other means which defines a pocket into which the end of finger portion portion 13 may be inserted. According, the cover 70 may be preassembled on the finger portion 13 of clip 10 so that the cover 70 is attached to the clip 10 and properly aligned to accommodate a device package 20. Such pre-assembly eliminates some of the problems associated with assembly of all the components simultaneously. As shown in FIG. 6 the cover 70 is supported on the finger portion 13 but relatively free to pivot about the finger portion 13 to permit self-alignment with the package 20 when assembled.

It will be readily recognized that the elongated body 10 can be formed in various shapes and designs by conventional manufacturing techniques to accommodate a wide variety of device packages. Furthermore, dimensions of the components thereof, as well as the dimensions of the corresponding grooves, shoulders, etc., of the accommodating heat sinks can be formed as desired. Accordingly, applying the principles of the invention, various designs of spring clips embodying hooks which engage grooves in heat sinks can be formed to provide means for rapidly and efficiently attaching electronic device packages to heat sinks without special tools and without causing damage to the electronic device package. It is to be understood, therefore, that although the invention has been described with particular reference to specific embodiments thereof, the forms of the invention shown and described in detail are to be taken as preferred embodiments of same. Various changes and modifications may be resorted to without departing from the spirit and scope of the invention as defined by the appended claims.

What is claimed:

1. A spring clip for attaching an electronic device package to a heat sink comprising a unitary body defining:
   (a) a base portion having first and second ends extending in opposite directions from and substantially coplanar with a substantially flat face;
   (b) a spring portion extending from said base portion intermediate said first and second ends and projecting in a direction opposite said substantially flat face; and
   (c) a finger portion extending from said spring portion and adapted to mate with an electronic device package and urge the device package into contact with a heat sink;
   wherein said substantially flat face lies in a first plane and said finger portion projects from said spring portion toward said first plane.

2. A spring clip for attaching an electronic device package to a heat sink comprising a unitary body defining:
   (a) a base portion having first and second ends extending in opposite directions from and substantially coplanar with a substantially flat face;
   (b) a spring portion extending from said base portion intermediate said first and second ends and protecting in a direction opposite said substantially flat face; and
   (c) a finger portion extending from said spring portion and adapted to mate with an electronic device package and urge the device package into contact with a heat sink;
   wherein said substantially flat face lies in a first plane and said finger portion projects from said spring portion toward a second plane substantially normal to said first plane.

3. A spring clip for attaching an electronic device package to a heat sink comprising a unitary body defining:
   (a) a base portion having first and second ends extending in opposite directions from and substantially coplanar with a substantially flat face;
   (b) a spring portion extending from said base portion intermediate said first and second ends and projecting in a direction opposite said substantially flat face;
   (c) a finger portion extending from said spring portion and adapted to mate with an electronic device package and urge the device package into contact with a heat sink; and
   (d) an aperture in said spring portion.

4. A spring clip for attaching an electronic device package to a heat sink comprising a unitary body defining:
   (a) a base portion having first and second ends extending in opposite directions from and substantially coplanar with a substantially flat face;
   (b) a spring portion extending from said base portion intermediate said first and second ends and projecting in a direction opposite said substantially flat face;
   (c) a finger portion extending from said spring portion and adapted to mate with an electronic device package and urge the device package into contact with a heat sink; and
   (d) an insulating material secured to said finger portion;
   wherein said insulating material is an insulating cover which defines a pocket and said finger portion of said spring clip is secured within said pocket.

5. The combination comprising:
   (a) a heat sink having a first surface, a second surface and a shoulder extending from the plane of said second surface with a groove in said shoulder substantially forming an extension of said second surface;
   (b) an electronic device package having a face positioned adjacent said first surface; and
   (c) a spring clip securing said device package adjacent said first surface comprising a unitary body defining:
      (i) a base portion having first and second ends extending in opposite directions from and substantially coplanar with a substantially flat face positioned adjacent said second surface with said first end positioned in said groove;
      (ii) a spring portion extending from said base portion intermediate said first and second ends; and
      (iii) a finger portion extending from said spring portion urging said device package into contact with said first surface.

6. The combination defined in claim 5 wherein said first surface and said second surface lie in substantially parallel planes.

7. The combination defined in claim 5 wherein said first surface lies in a plane which is substantially normal to the plane of said second surface.

8. The combination defined in claim 5 wherein said second surface is defined by said shoulder and a second shoulder.

9. The combination defined in claim 8 wherein the distance between said shoulder and said second shoulder is less than the length of said base portion.

10. The combination defined in claim 5 including an insulating material secured to said finger portion and positioned between said finger portion and said electronic device package.

11. The combination defined in claim 10 wherein said insulating material is an insulating cover which provides a predetermined creep distance between the electronic device package and said finger.

12. The combination defined in claim 11 wherein said insulating cover is pivotally attached to said finger portion.

* * * * *

UNITED STATES PATENT AND TRADEMARK OFFICE
CERTIFICATE OF CORRECTION

PATENT NO. : 5,466,970
DATED : Nov. 14, 1995
INVENTOR(S) : Smithers

It is certified that error appears in the above-identified patent and that said Letters Patent is hereby corrected as shown below:

Col. 2, line 12, after portion" (first occurrence), insert a comma (,)

Col. 5, line 39, change "protecting" to read ---projecting---

Signed and Sealed this

Twentieth Day of February, 1996

Attest:

Attesting Officer

BRUCE LEHMAN
Commissioner of Patents and Trademarks